United States Patent
McGinley et al.

(10) Patent No.: US 6,218,838 B1
(45) Date of Patent: Apr. 17, 2001

(54) MRI MAGNET WITH HIGH HOMOGENEITY, PATIENT ACCESS, AND LOW FORCES ON THE DRIVER COILS

(75) Inventors: John V. M. McGinley, London; Ian R. Young, Marlborough, both of (GB); Gordon D. DeMeester, Wickliffe, OH (US); Ilmari Kinanen, Espoo (FI)

(73) Assignee: Picker International, Inc., Highland Heights, OH (US)

( * ) Notice: Subject to any disclaimer, the term of this patent is extended or adjusted under 35 U.S.C. 154(b) by 0 days.

(21) Appl. No.: 09/141,708

(22) Filed: Aug. 28, 1998

(51) Int. Cl.[7] ................................... G01V 3/00
(52) U.S. Cl. ................................................ 324/320
(58) Field of Search ........................ 324/320, 322

(56) References Cited

U.S. PATENT DOCUMENTS

| | | | |
|---|---|---|---|
| 4,710,741 | 12/1987 | McGinley | 335/296 |
| 5,162,768 | 11/1992 | McDougall et al. | 335/296 |
| 5,436,607 | 7/1995 | Chari et al. | 335/216 |
| 5,550,472 * | 8/1996 | Richard et al. | 324/320 |
| 5,647,361 | 7/1997 | Damadian | 128/683.2 |

* cited by examiner

Primary Examiner—Christine Oda
Assistant Examiner—Dixomara Vargas
(74) Attorney, Agent, or Firm—Fay, Sharpe, Fagan, Minnich & McKee, LLP

(57) ABSTRACT

A pair of annular magnets (10) generate a vertical magnetic flux field through an imaging volume (12). The flux is focused by a pair of Rose rings (26) of high cobalt steel. A high order shim set includes a plurality of permanently magnetized or magnetized iron rings (32a, 32b, 32c, 32d) which cooperatively interact with the magnet assembly to optimize the homogeneity of the magnetic flux through the imaging volume. One of the permanent magnetic rings (32d), is mounted with an opposite polarity relative to the others. The magnetized rings are mounted in a non-ferrous, electrically insulating support structure (34) such that gradient coils (50) can be positioned behind the permanent magnet rings. A flux return path (14, 16, 18, 20, 22, 24) provides a low flux resistant path from adjacent the Rose ring at one side of the imaging volume remotely around the imaging volume to a position adjacent the Rose ring at the other side of the imaging volume.

22 Claims, 2 Drawing Sheets

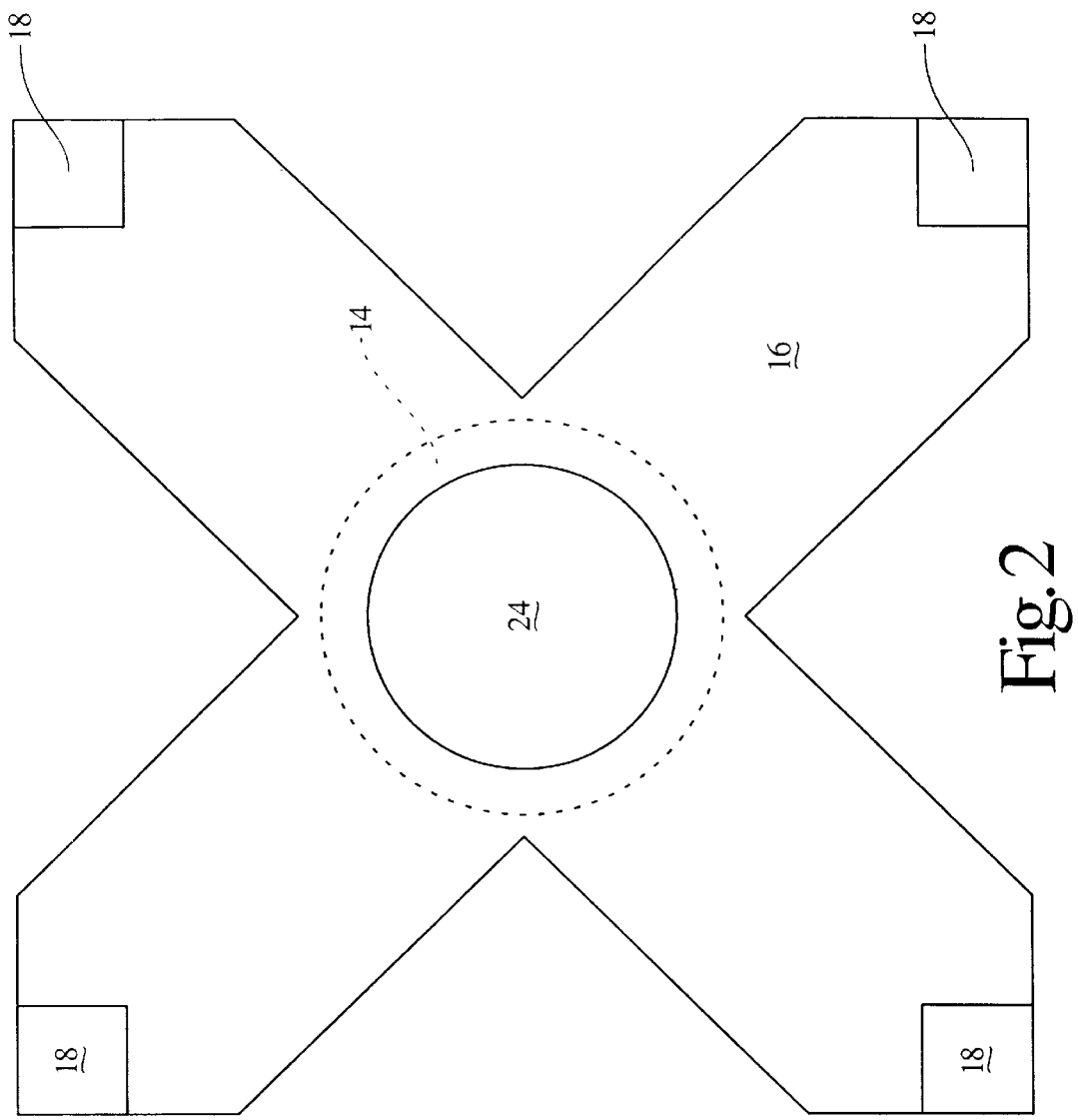

MRI MAGNET WITH HIGH HOMOGENEITY, PATIENT ACCESS, AND LOW FORCES ON THE DRIVER COILS

BACKGROUND OF THE INVENTION

The present application relates to the magnetic resonance arts. It finds particular application in conjunction with diagnostic imaging at surgical sites and will be described with particular reference thereto. However, it is to be appreciated that the invention will also find application in other magnetic imaging, spectroscopy, and therapy applications.

Early magnetic resonance imaging systems were based on solenoid magnets. That is, a series of annular magnets were placed around a bore through which a magnetic field was generated longitudinally. A patient was selectively moved axially along a horizontal central axis of the bore to be positioned for imaging. Magnetic resonance imaging systems with solenoid magnets tended to be claustrophobic to the patient. Moreover, access to the patient for surgical, minimally invasive procedures, physiological tests, equipment, and the like was limited and awkward.

To provide for patient access and reduce the claustrophobic effect in patients, open or vertical field magnets have been devised. Open magnets typically include a ferrous flux return path in the form of a "C", "H", or four-poster arrangement. The flux return paths have an open gap within which the patient is disposed for imaging. Due to the difference in the susceptibility of the flux return path and the air in the patient gap, there tends to be non-linearity and other magnetic flux errors in the patient receiving gap. In order to generate a more uniform magnetic flux field through the gap, a large ferrous pole piece is typically positioned at the ends of the flux return path on either side of the patient receiving gap. The pole pieces are shaped and contoured, as appropriate, to generate a more uniform magnetic flux between the pole pieces. Typically, a heavy ferrous ring, known as a Rose ring, is positioned along the circumference of the pole piece to drive the magnetic flux towards the center of the pole piece and the patient receiving gap.

Although the use of pole pieces has been successful, there are drawbacks. First, in magnetic resonance imaging, magnetic field gradients are generated across the imaging volume. The gradient coils are positioned between the pole pieces and the patient. When the gradient coils include shield coils, the space occupied by the self-shielded gradient coils is even larger. The physical space occupied by the gradient coils exasperates the tradeoff between the desire to have a large patient receiving gap for better patient access and less claustrophobia, and the desire to position the pole pieces closer together for a more uniform magnetic field. Second, the pole pieces are typically thick ferrous disks with a diameter about 2–3 times the height of the patient receiving gap. The massive metal pole pieces raise difficult engineering design problems to provide for their stable support with a minimal blocking of patient access.

This application provides a new and improved magnetic resonance imaging system which overcomes the above-referenced problems and others.

SUMMARY OF THE INVENTION

In accordance with the present invention, a magnetic resonance imaging system includes a pair of ferrous, Rose rings disposed parallel to each other on opposite sides of an imaging volume. A magnetic flux return path extends from a point adjacent one of the Rose rings, remotely around the imaging volume, to a point adjacent the other Rose ring. A magnetic flux source causes a magnetic flux through the imaging volume, between the rings, and through the magnetic flux return path. A plurality of magnetized rings are mounted in a location surrounded by the ferrous Rose rings to modify the magnetic flux passing through the imaging volume.

In accordance with another aspect of the present invention, a magnetic resonance system includes a source of magnetic flux. At least one annular, ferrous Rose ring concentrates the magnetic flux across an imaging volume. A plurality of permanent magnets are disposed in the magnetic flux adjacent the imaging volume to adjust a magnetic flux density in the imaging volume.

In accordance with a more limited aspect of the present invention, physical structures associated with the magnetic flux source, the Rose rings, the flux return path, and the permanent magnets cooperatively interact to optimize uniformity of the magnetic flux in the imaging volume.

One advantage of the present invention is that it facilitates the design of open magnets with stronger magnetic fields.

Another advantage of the present invention is that it improves magnetic field homogeneity.

Another advantage of the present invention resides in improved patient access.

Another advantage of the present invention resides in a reduction of potential eddy currents.

Yet another advantage of the present invention resides in the reduced pole mass.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
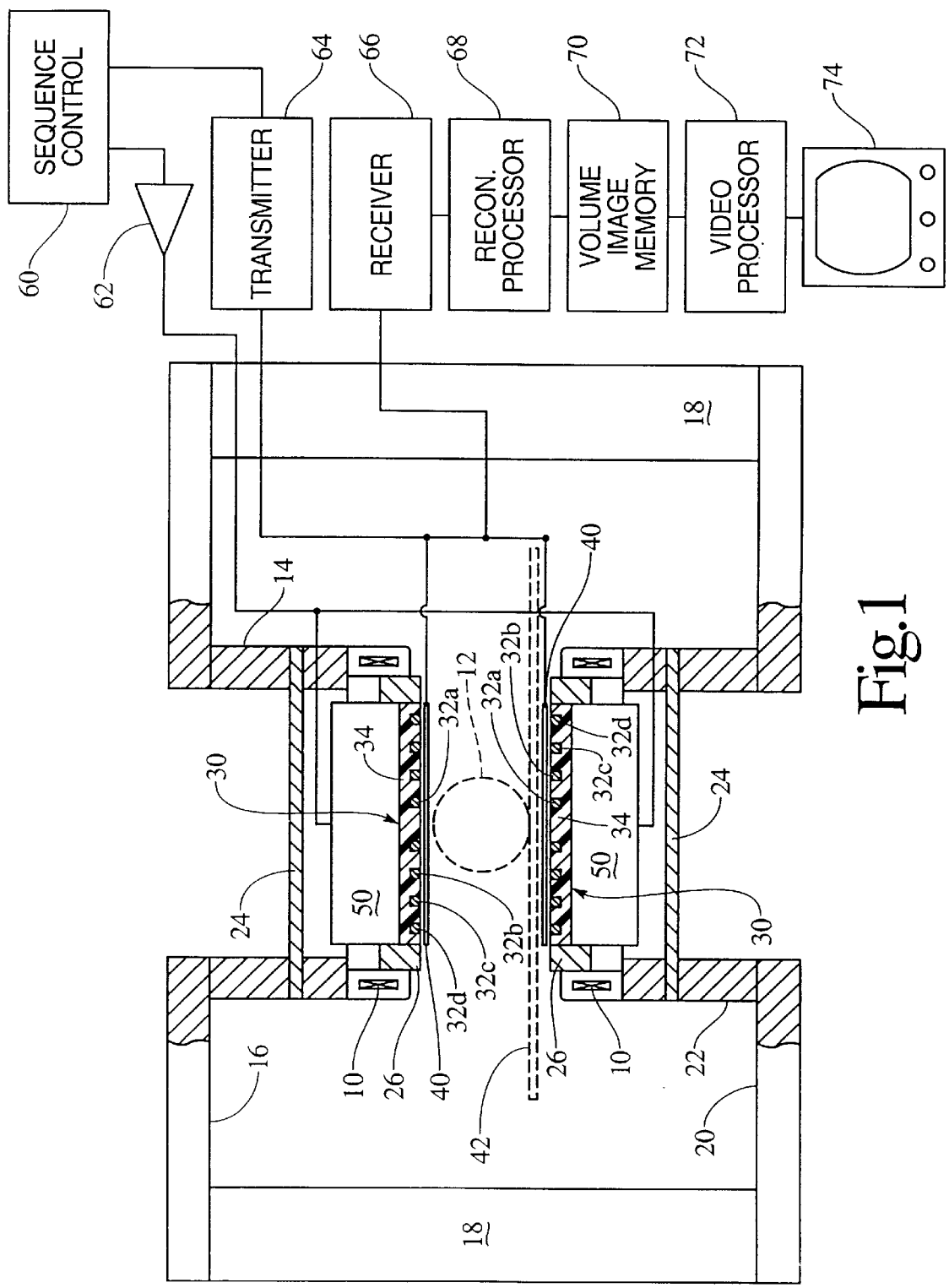
FIG. 1 is an elevational view in partial section of a magnetic resonance imaging system in accordance with the present invention; and, FIG. 2 is a top view of the magnet system of FIG. 1.

With reference to FIG. 1, annular primary magnet coils 10, which preferably are superconducting, are disposed in a pair of parallel, horizontal planes on either side of an imaging volume 12. The primary magnet coils generate a temporally constant magnetic field through the imaging volume, in the vertical direction in the illustrated embodiment. A magnetic flux return path includes an annular ferrous ring 14, a top plate 16, a plurality of posts 18, a bottom plate 20, a lower annular ferrous ring 22, and a ferrous plug 24. The flux return path provides a low resistance flux path in a loop or series of loops with a gap across the imaging volume 12. Optionally, a single magnet may be utilized or the magnet(s) may be placed at other locations along the flux.

A Rose ring 26 focuses the magnetic flux improving uniformity and linearity in the imaging volume. Preferably, the Rose ring is constructed of a high cobalt steel such that it is more resistant to saturation, particularly at higher fields.

However, low carbon steel can also produce satisfactory results at lower cost. The Rose ring is preferably constructed in segments or elements to minimize the potential for eddy currents. Plates or spirals of sheet metal wrapped around a vertical axis, and other horizontal cross section limiting constructions are preferred. In the preferred embodiment, Rose rings are disposed at opposite sides of the imaging volume.

A high order shim set 30 is mounted across the Rose ring 26. In the preferred embodiment, with a pair of Rose rings, like high order shim sets are mounted across each Rose ring. More specific to the preferred embodiment, magnetized rings 32a, 32b, 32c, and 32d are mounted symmetrically in each pole ring set. The magnetized rings alter the magnetic field or flux through the imaging volume. More specifically, the pole rings and the Rose ring, ferrous rings 14, 22, and other flux return path constructions interact to maximize the uniformity of the magnetic field in the imaging volume. In the preferred embodiment, the Rose ring and the flux return path on one hand and the pole face ring set 30 on the other hand are both constructed to have a non-uniform, but counterbalancing effect on the magnetic field in the imaging volume. That is, the magnet assembly is purposely constructed to have a non-uniform magnetic flux in the imaging volume, which is non-uniform in such a way that the presence of the pole rings makes the flux homogeneous.

The exact diameter of the pole rings and their number is mathematically estimated and iteratively adjusted until the magnetic flux in the imaging volume is optimized. It is to be appreciated that the size, width, and number of rings will vary with the strength of the magnetic field and the geometry of the magnets. For magnetic fields in the 0.5–0.75 Tesla range, four rings are preferred, with the fourth ring from the center 32d, having its polarity reversed relative to the other three rings. At least the magnetized ring of the reversed polarity is constructed of a permanent magnetic material which remains magnetic, even in magnetic fields of the 0.5–0.75 Tesla range, preferably (NdBFe) neodymium-boron-iron alloy. The rings with non-reversed polarity can be constructed of permanently magnetized material or of a material that is magnetized by the main magnetic field. Preferably, the pole rings are constructed of balls or pellets which are pressed and fired in a sintering type operation into ring segments. A plurality of the ring segments are positioned to make up each ring. Other ring constructions which minimize eddy currents are also contemplated. Windings and coils could also be utilized. The rings are supported on a non-ferrous, non-magnetic flux conducting, electrically insulating material such as a fiber reinforced epoxy disk or other construction 34. The non-ferrous construction 34 has sufficient structural strength to hold the position of the pole rings steady under the large forces applied by the primary magnetic field. Yet, the construction 34 is magnetically and radio frequency transmissive. In the preferred embodiment, the ring supporting construction 34 also has pockets or other mounting structure for receiving neodymium-boron-iron alloy, or other permanent magnetic shims for shimming the magnetic field for greater homogeneity.

Radio frequency excitation and receive coils are disposed adjacent the imaging volume. In the illustrated embodiment, planar, whole-body radio frequency coils 40 are mounted on facing surfaces of the ring support construction 34. Of course, other radio frequency coil constructions, such as surface coils mounted directly on appropriate portions of the patient, coils embedded in a patient support 42, and the like, are also contemplated.

Gradient magnetic field coils 50, preferably self-shielded gradient coils, are disposed behind the rings set 30. Because the ring support construction is not magnetically responsive, unlike a ferrous pole piece, and the magnetic field gradients generated by the gradient coils pass freely to the imaging volume.

In the preferred embodiment, the position of the magnet coil 10, the Rose ring, and the adjust sections of the return path are selected to null the axial forces on the coil. This simplifies mechanical suspension of the cryostat. Less bulk in the suspension system tends to reduce heat loss and boil off in the cryostat.

In operation, a sequence control circuit 60 controls gradient coil amplifiers 62 and a transmitter 64 in accordance with a preselected magnetic resonance imaging sequence to induce magnetic resonance echoes in tissue or other material in the imaging volume 12. A radio frequency receiver 66 is connected with the coils 40 or surface coils (not shown) to receive the induced magnetic resonance echoes. The received magnetic resonance signals are reconstructed by a reconstruction processor 68, preferably using an inverse Fourier transform algorithm, into an electronic image representation for storage in an image memory 70. A video processor 72 under the control of an operator control panel withdraws selected portions of the reconstructed image and converts them into appropriate format for display on a video or other monitor 74.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance system including a pair of ferrous rings disposed parallel to each other on opposite sides of an imaging volume, magnetic field source which causes a magnetic field through the imaging volume, between the rings, and further including:
   a high order shim set including a plurality of individual magnetized rings in addition to and surrounded by each of the ferrous rings to alter magnetic field homogeneity in the imaging volume and make the field more uniform.

2. A magnetic resonance system comprising:
   a pair of ferrous rings disposed parallel to each other on opposite sides of an imaging volume;
   a magnetic field source which causes a magnetic field through the imaging volume, between the rings;
   a pair of high order shim sets including a plurality of individual magnetized rings surrounded by each of the ferrous rings to focus the magnetic field passing through the imaging volume and make the magnetic field more uniform;
   a pair of non-ferrous support structures, each non-ferrous support structure supporting the magnetized rings of one of the high order shim sets, the non-ferrous supports supporting the magnetized rings of the high order shim sets concentric with the ferrous rings.

3. The magnetic resonance imaging system as set forth in claim 2 further including:
   gradient coils disposed on an opposite side of the magnetized rings from the imaging volume.

4. The magnetic resonance system as set forth in claim 1 wherein the magnetized rings are disposed in concentric rings.

5. A magnetic resonance system including a pair of ferrous rings disposed parallel to each other on opposite sides of an imaging volume, a magnetic field source which causes a magnetic field through the imaging volume between the rings, and further including:
   a high order shim set including a plurality of individual magnetized rings disposed in concentric rings surrounded by the ferrous rings to make the magnetic field in the imaging volume more uniform, at least one of the high order shim set rings having a permanent magnet ring of an opposite magnetic polarity relative to another of the magnetized rings.

6. The magnetic resonance system as set forth in claim 1 wherein the source of magnetic flux includes a pair of annular magnets, each magnet being disposed around one of the ferrous rings and adjacent the flux return path.

7. A magnetic resonance system comprising:
   a pair of ferrous rings disposed parallel to each other on opposite sides of an imaging volume;
   a magnetic field source which causes a magnetic field through the imaging volume, between the rings;
   a high order shim set including a plurality of individual magnetized rings surrounded by the ferrous rings to focus the magnetic flux passing through the imaging volume and make the flux more uniform, at least one of the magnetized rings of the shim set being constructed of permanently magnetized material.

8. The magnetic resonance system as set forth in claim 7 wherein the permanently magnetized ring is constructed of a neodymium-boron-iron alloy.

9. The magnetic resonance system as set forth in claim 8 wherein the permanently magnetized ring is sintered.

10. The magnetic resonance system as set forth in claim 7 wherein the ferrous rings are constructed of high cobalt steel.

11. A magnetic resonance system comprising:
   a source of magnetic flux;
   an annular, ferrous Rose ring which concentrates the flux across an imaging volume;
   a plurality of concentric magnetized rings apart from the ferrous Rose ring disposed in the magnetic flux adjacent the imaging volume for adjusting a magnetic flux density in the imaging volume.

12. A magnetic resonance system comprising:
   a magnetic field source;
   an annular, ferrous Rose ring which concentrates the flux across an imaging volume; and,
   a plurality of magnetized rings disposed in the magnetic field adjacent the imaging volume for adjusting a magnetic field density in the imaging volume, at least one of the magnetized rings being a permanent magnet and having an opposite polarity to another of the magnetized rings.

13. The magnetic resonance system as set forth in claim 11 further comprising:
   a non-ferrous mounting structure for mounting the magnetized rings symmetrically within the Rose ring.

14. A magnetic resonance system comprising:
   a magnetic field source;
   an annular, ferrous Rose ring which concentrates the magnetic field across an imaging volume;
   a non-ferrous mounting structure mounted within the Rose ring;
   a plurality of magnetized rings mounted on the non-ferrous mounting structure adjacent the imaging volume;
   a radio frequency coil mounted on an imaging volume side of the non-ferrous mounting structure;
   a gradient magnetic field coil for creating magnetic field gradients across the imaging volume disposed on an opposite side of the non-ferrous mounting structure from the radio frequency coil and the imaging volume;
   a sequence control processor for controlling a magnetic resonance imaging sequence;
   gradient amplifiers which operate under control of the sequence control processor to cause the gradient magnetic field coils to generate magnetic field gradient pulses;
   a radio frequency transmitter operated under the control of the sequence control processor to cause the radio frequency coil to generate radio frequency pulses;
   a radio frequency receiver for receiving magnetic resonance signals emanating from the imaging volume;
   a reconstruction processor for reconstructing the received magnetic resonance radio frequency signals into an image representation.

15. The magnetic resonance system as set forth in claim 11 wherein the magnetic flux source includes:
   at least one annular magnet disposed at least partially surrounding the Rose ring.

16. The magnetic resonance system as set forth in claim 14 further including a flux return path including:
   a ferrous ring disposed adjacent the annular magnet;
   ferrous segments extending from the annular ring and around to an opposite side of the imaging volume.

17. A magnetic resonance method comprising:
   inducing a magnetic field through an imaging volume;
   concentrating the magnetic field with a ferrous ring;
   adjusting homogeneity of the magnetic field with permanent magnetic material disposed adjacent the imaging volume.

18. The method as set forth in claim 17 wherein the ferrous element is an annular ring of cobalt steel and the permanent magnetic material includes annular rings of NdBFe alloy.

19. The method as set forth in claim 17 further including:
   inducing magnetic field gradients across the examination region;
   applying radio frequency pulses to excite magnetic resonance;
   receiving excited resonance signals from the imaging volume;
   reconstructing the received resonance signals into an image representation.

20. The magnetic resonance system as set forth in claim 1 wherein the plurality of magnetized rings includes at least three individual magnetized rings on each side of the imaging volume.

21. The magnetic resonance system as set forth in claim 1 wherein the magnetized rings are segmented.

22. The method as set forth in claim 17 wherein the permanent magnetic material is arranged in a plurality of rings, one of the rings having an opposite polarity relative to another of the rings.

* * * * *